(12) United States Patent
Ko et al.

(10) Patent No.: US 12,308,083 B2
(45) Date of Patent: May 20, 2025

(54) VOLATILE MEMORY DEVICES AND METHODS OF OPERATING SAME TO IMPROVE RELIABILITY

(71) Applicant: Samsung Electronics Co., Ltd., Suwon-si (KR)

(72) Inventors: Junyoung Ko, Suwon-si (KR); Jungmin Bak, Suwon-si (KR); Changhwi Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 89 days.

(21) Appl. No.: 18/347,631

(22) Filed: Jul. 6, 2023

(65) Prior Publication Data
US 2024/0212775 A1 Jun. 27, 2024

(30) Foreign Application Priority Data
Dec. 27, 2022 (KR) .................. 10-2022-0186347

(51) Int. Cl.
*G11C 29/12* (2006.01)
(52) U.S. Cl.
CPC .............................. *G11C 29/12005* (2013.01)
(58) Field of Classification Search
CPC ... G11C 29/42; G11C 29/52; G11C 29/12005; G11C 16/24; G11C 16/28; G11C 16/26; G11C 16/3495
See application file for complete search history.

(56) References Cited

U.S. PATENT DOCUMENTS

| | | | |
|---|---|---|---|
| 6,483,764 B2 | 11/2002 | Chen et al. | |
| 7,990,795 B2 | 8/2011 | Pelley et al. | |
| 8,161,333 B2 | 4/2012 | Kasuga et al. | |
| 9,646,718 B2 | 5/2017 | Park et al. | |
| 9,997,255 B2 | 6/2018 | Sridhara | |
| 10,497,457 B2 | 12/2019 | Tsern et al. | |
| 10,942,799 B1* | 3/2021 | Khakifirooz | G11C 16/14 |
| 11,011,248 B2 | 5/2021 | Tsern et al. | |
| 2017/0084314 A1* | 3/2017 | Fritsch | G11C 29/028 |
| 2020/0211662 A1* | 7/2020 | Cariello | G06F 3/0679 |

FOREIGN PATENT DOCUMENTS

| | | |
|---|---|---|
| JP | 5544712 B2 | 5/2014 |
| KR | 102193682 B1 | 12/2020 |

OTHER PUBLICATIONS

Bepary et al. "DRAM Retention Behavior with Accelerated Aging in Commercial Chips" Applied Sciences 12(9):4332 (Apr. 2022).

* cited by examiner

*Primary Examiner* — Shelly A Chase
(74) *Attorney, Agent, or Firm* — Myers Bigel, P.A.

(57) ABSTRACT

A volatile memory device includes an array of memory cells connected to word lines, and bit lines, which are connected to a bitline sense amplifier. Control logic is provided, which is configured to control: (i) consecutive self-refresh operations within the array of memory cells, (ii) storage of dummy data within the array of memory cells during operations to predict life expectancy of memory cells therein, (iii) consecutive test refresh operations within the array of memory cells, and (iv) performance of test sensing operations on selected memory cells within the array using the bitline sense amplifier. A deterioration detection circuit is provided, which is configured to receive sensing results associated with the selected memory cells from the bitline sense amplifier.

20 Claims, 11 Drawing Sheets

| Condition | Output | Fail Bit |
|---|---|---|
| iMBC < iR1 | ALL=0 | 0 |
| iR1 ≤ iMBC < iR2 | OUT1=1 | 1 |
| iR2 ≤ iMBC < iR3 | OUT2=1 | 2 |
| ⋮ | | |
| iR(n-2) ≤ iMBC < iR(n-1) | OUT(n-2)=1 | n-2 |
| iR(n-1) ≤ iMBC < iRn | OUT(n-1)=1 | n-1 |
| iRn ≤ iMBC | ALL=1 | n |

FIG. 10

VOLATILE MEMORY DEVICES AND METHODS OF OPERATING SAME TO IMPROVE RELIABILITY

REFERENCE TO PRIORITY APPLICATION

This application claims benefit of priority to Korean Patent Application No. 10-2022-0186347, filed Dec. 27, 2022, the disclosure of which is hereby incorporated herein by reference.

BACKGROUND

The present disclosure relates to integrated circuit memory devices and, more particularly, to volatile memory devices and methods of operating same.

Semiconductor memory devices are typically classified into volatile memory devices and nonvolatile memory devices. Volatile memory devices include, for example, dynamic random access memory (DRAM) devices and static random access memory (SRAM) devices, which typically have relatively high reading and writing speeds, but lose their stored data when their power supplies are interrupted. In contrast, nonvolatile memory devices typically retain their stored data even when their power supplies are interrupted.

A representative example of a volatile memory is a DRAM. In a DRAM, a memory cell may include a single N-type transistor, serving as a switch (or access transistor), and a single capacitor storing electric charges (data). Binary information "1" or "0" may correspond to the presence or absence of the electric charges stored in the capacitor in the memory cell, and be reflected whether a terminal voltage of a cell capacitor is high or low. A memory cell may be connected to a wordline, and a bitline, which is typically connected to a sense amplifier. The sense amplifier may sense data that is stored in the memory cell, via a corresponding bitline, in response to application of a voltage to a corresponding wordline.

As will be understood by those skilled in the art, memory cells of a volatile memory may be deteriorated as a result of various factors. And, when memory cells become deteriorated, performance of the volatile memory may be degraded. To insure proper operation of a volatile memory, deteriorated memory cells need to be regularly detected and removed from a read/write path of the memory.

SUMMARY

Example embodiments provide a volatile memory device that: (i) stores dummy data in selected memory cells connected to a selected wordline, (ii) performs test refresh operations having a longer period than normal self-refresh operations, and then (iii) performs a test sensing operation on the selected memory cells to generate multi-bit-count current including deterioration information of the selected memory cells, and (iv) counts the number of deteriorated memory cells, among the selected memory cells, based on the multi-bit-count current. Advantageously, example embodiments provide a method of predicting life expectancy of all memory cells in the volatile memory device based on the number of deteriorated memory cells.

According to another example embodiment, a volatile memory device includes: a memory cell array including a plurality of memory cells connected to wordlines and bitlines; a bitline sense amplifier configured to sense data stored in the plurality of memory cells, through the bitlines; and control logic configured to perform self-refresh with a first period to maintain the data stored in the plurality of memory cells, to store dummy data stored in the selected memory cells to predict life expectancy of selected memory cells connected to a selected wordline, and to perform test refresh on the selected memory cells with a second period, greater than the first period, and then perform a test sensing operation of the selected memory cells through the bitline sense amplifier. A deterioration detection circuit may also be provided, which is configured to receive sensing results of the selected memory cells from the bitline sense amplifier and to output multi-bit-count current in proportion to the number of deteriorated memory cells, among the selected memory cells, based on the sensing results during the test sensing operation. Advantageously, the control logic may predict life expectancy of the memory cell array based on a magnitude of the multi-bit-count current.

According to a further example embodiment, a volatile memory device includes: a plurality of memory cells connected to wordlines and bitlines; sense amplifiers, each configured to data stored in each of selected memory cells connected to a selected wordline through each of the bitlines; control logic configured to perform self-refresh with a first period to maintain data stored in the plurality of memory cells, to store dummy data assigned to the selected memory cells to predict life expectancy of the selected memory cells, and to perform test refresh on the selected memory cells with a second period, longer than the first period, and then perform a test sensing operation of the selected memory cells through the sense amplifiers. A deterioration detection circuit is also provided, which includes deterioration detection paths respectively connected to control lines of the sense amplifiers, and configured to merge deterioration detection currents respectively output through the detection paths, to output multi-bit-count current based on a voltage of each of the control lines during the test sensing operation. Bit counters may also be provided, which are configured to compare the multi-bit-count current with reference currents to output result values.

According to another example embodiment, a method of predicting life expectancy of a volatile memory device includes: (i) performing self-refresh by the nonvolatile memory device to maintain data stored in a plurality of memory cells, (ii) storing dummy data in selected memory cells connected to a selected wordline, among the plurality of memory cells, (iii) performing test refresh on the selected memory cells with a second period longer than the first period, (iv) performing a test sensing operation on the selected memory cells, (v) generating multi-bit-count current based on a voltage of control lines of sense amplifiers respectively connected to the selected memory cells through bitlines during the test sensing operation, (vi) outputting result values by comparing the multi-bit-count current with each of a plurality of reference currents, and (vii) counting the number of deteriorated memory cells among the selected memory cells, based on the result values.

BRIEF DESCRIPTION OF DRAWINGS

The above and other aspects, features, and advantages of the present disclosure will be more clearly understood from the following detailed description, taken in conjunction with the accompanying drawings.

FIG. 10 is a table for predicting life expectancy of a memory device based on a result of the multi-bit counter of FIG. 9.

DETAILED DESCRIPTION

Hereinafter, example embodiments will be described with reference to the accompanying drawings. For example, as described hereinbelow, a DRAM will be used as an example for illustrating features and functions of the present disclosure. However, other features and performances may be easily understood from information disclosed herein by a person of ordinary skill in the art. The present disclosure may be implemented by other embodiments or applied thereto. Further, the detailed description may be modified or changed according to viewpoints and applications without escaping from the scope, spirit, and other objects of the present disclosure.

Figure 1:
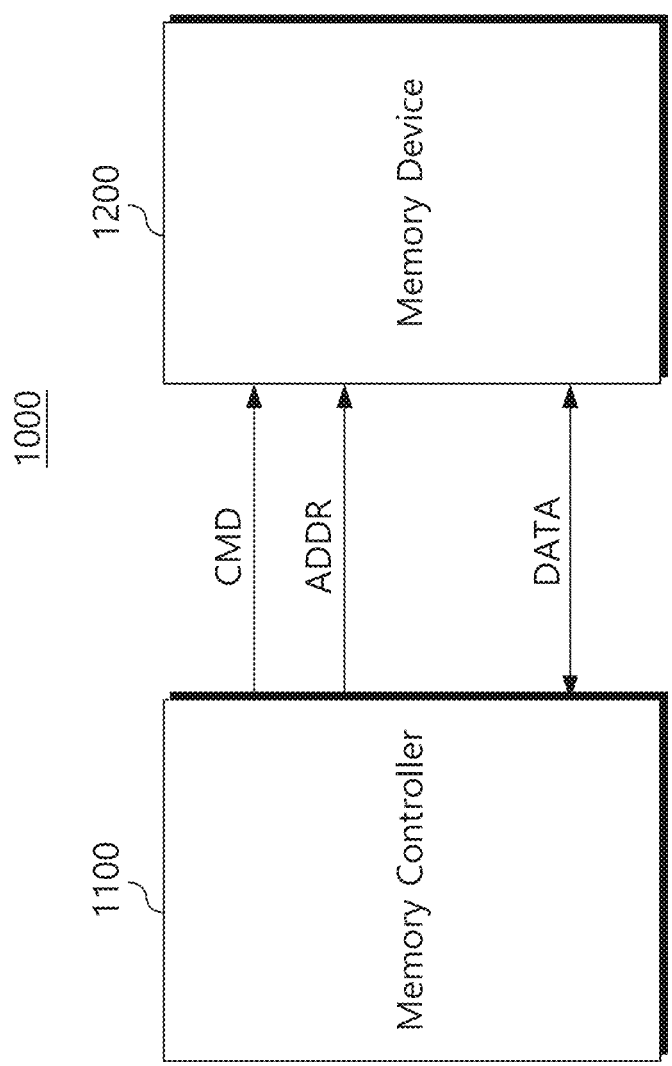
FIG. 1 is a block diagram illustrating a memory system according to an example embodiment.

FIG. 1 is a block diagram illustrating a memory system according to an example embodiment. Referring to FIG. 1, a memory system 1000 according to the present embodiment may include a memory controller 1100 and a memory device 1200.

According to an example embodiment, the memory controller 1100 may perform an access operation to write data in the memory device 1200 or read data stored in the memory device 1200. For example, the memory controller 1100 may generate a command CMD and an address ADDR for writing data in the memory device 1200 or reading data stored in the memory device 1200. The memory controller 1100 may include at least one a memory controller controlling the memory device 1200, a system-on-chip (SoC) such as an application processor (AP), a central processing unit (CPU), a digital signal processor (DSP), and a graphics processing unit (GPU).

According to an example embodiment, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data in the memory device 1200 or to read data from the memory device 1200.

According to an example embodiment, the memory controller 1100 may generate various types of commands CMD to control the memory device 1200. For example, the memory controller 1100 may generate a bank request corresponding to a bank operation of changing a state of a memory bank, among memory banks, to read or write data. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data is completed. In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to control a refresh operation on the memory banks. However, the types of commands CMD described herein are merely exemplary, and other types of commands CMD may be present.

According to an example embodiment, the memory device 1200 may output data DATA, requested to be read by the memory controller 1100, to the memory controller 1100 or may store data DATA, requested to be written by the memory controller 1100, in a memory cell(s). The memory device 1200 may input and output data DATA based on the command CMD and the address ADDR. The memory device 1200 may include memory banks.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM). Alternatively, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but example embodiments are not limited thereto.

According to an example embodiment, the memory banks may include a memory cell array divided in units of banks, a row decoder, a column decoder, a sense amplifier, a write driver, and the like. The memory banks may store data DATA, requested to be written in the memory device 1200, through the write driver and may read data DATA, requested to be read, using the sense amplifier. The memory banks may further include a component for a refresh operation of storing and maintaining data in the cell array, or select circuits based on an address.

Figure 2:
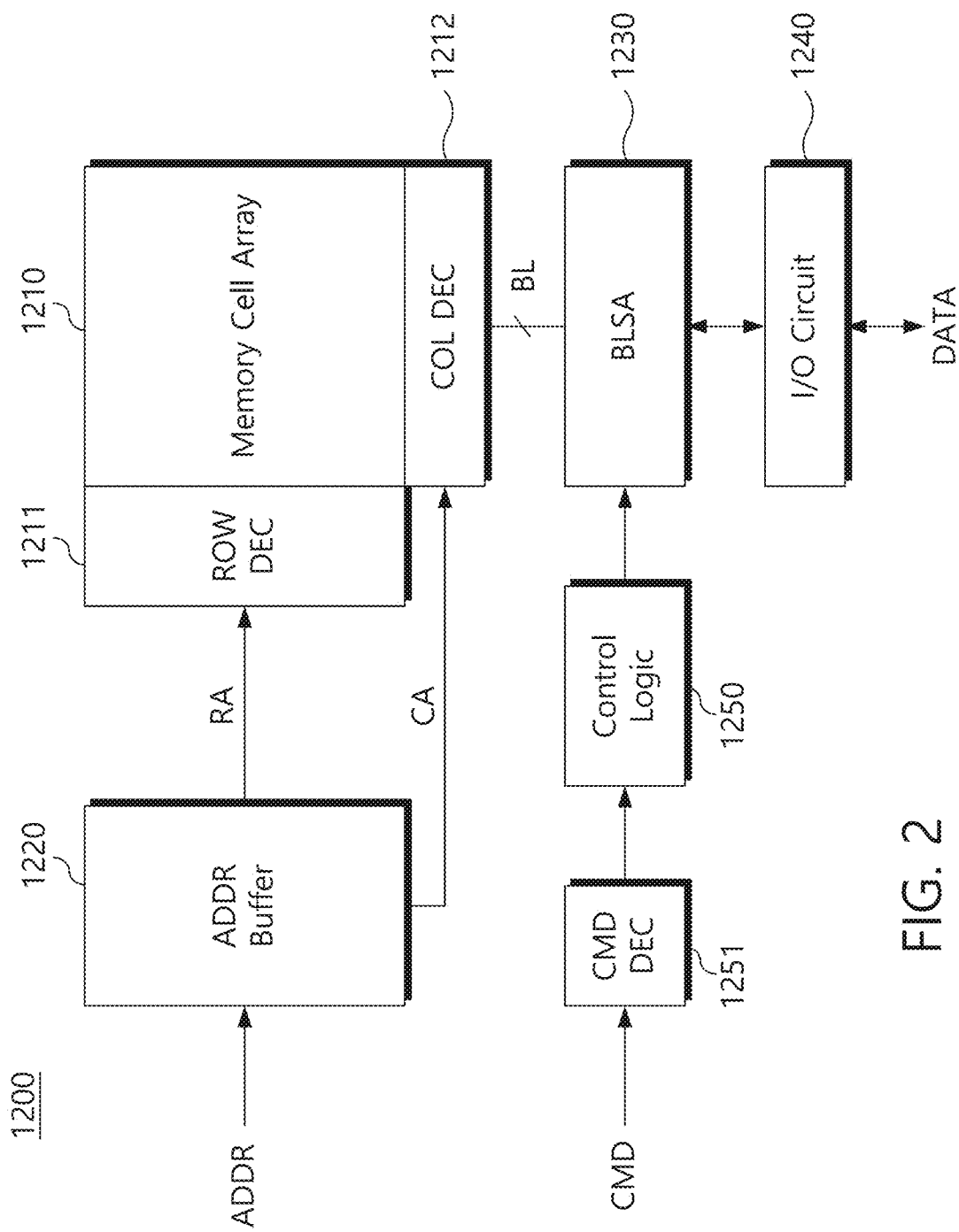
FIG. 2 is a block diagram illustrating a memory device of FIG. 1.

FIG. 2 is a block diagram illustrating a memory device of FIG. 1. Referring to FIG. 2, the memory device 1200 may include a memory cell array 1210, a row decoder 1211, a column decoder 1212, an address buffer 1220, a bitline sense amplifier 1230, an input/output circuit 1240, a command decoder 1251, and control logic 1250. According to an example embodiment, the memory cell array 1210 may include a plurality of memory cells arranged in a matrix of rows and columns. For example, the memory cell array 1210 may include a plurality of wordlines and a plurality of bitlines BL connected to memory cells in an array thereof. As will be understood by those skilled in the art, the plurality of wordlines may be connected to corresponding rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA, addressing a row of the memory cell array 1210, and a column address CA addressing a column of the memory cell array 1210. The address buffer 1220 may transmit the row address RA to the row decoder 1211 and may transmit the column address CA to the column decoder 1212. According to an example embodiment, the row decoder 1211 may select one of the plurality of wordlines connected to the memory cell array 1210. The row decoder 1211 may decode the row address RA, received from the address buffer 1220, to select a single wordline corresponding to the row address RA and may activate the selected wordline.

According to an example embodiment, the column decoder 1212 may select a predetermined bitline from among the plurality of bitlines BL of the memory cell array 1210. The column decoder 1212 may decode the column address CA, received from the address buffer 1220, to select the predetermined bitline BL corresponding to the column address CA.

According to an example embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage. The input/output circuit 1240 may output data DATA, output based on a sensed and amplified voltage, from the bitline sense amplifier 1230 to the memory controller 1100 through data lines.

According to an example embodiment, the command decoder 1251 may decode a write enable signal /WE, a row address strobe signal /RAS, a column address strobe signal /CAS, and a chip select signal /CS received from the memory controller 1100 such that control signals corresponding to the command CMD are generated in the control logic 1250. The command CMD may include an active request, a read request, a write request, or a precharge request. The control logic 1250 may control an overall operation of the bitline sense amplifier 1230 through the control signals corresponding to the command CMD.

Figure 3:
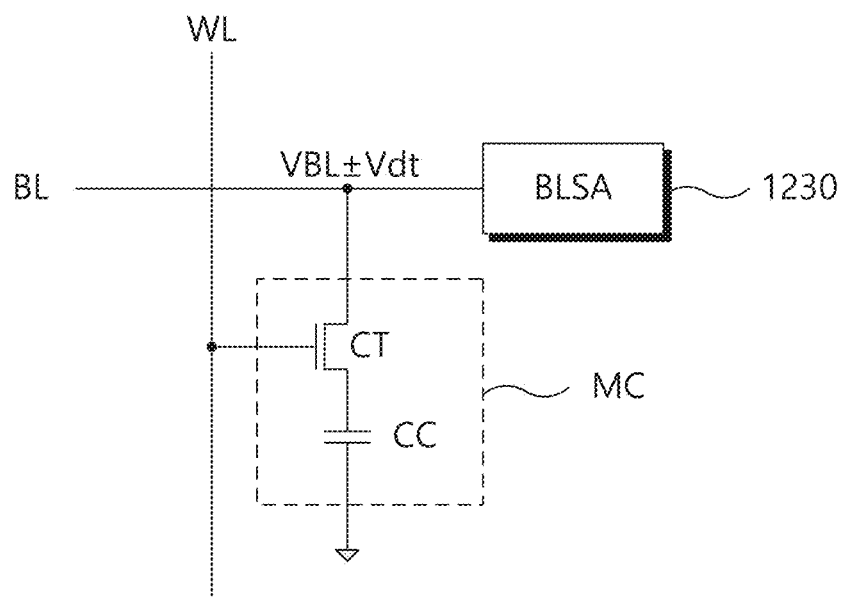
FIG. 3 is a diagram illustrating a bitline sense amplifier of FIG. 2 connected to a single memory cell.

FIG. 3 is a diagram illustrating a bitline sense amplifier of FIG. 2 connected to a single memory cell. Referring to FIGS. 2 and 3, a single memory cell MC included in the memory cell array 1210 may include a cell transistor CT and a cell capacitor CC. One end of the cell transistor CT may be connected to a bitline BL. The other end of the cell transistor CT may be connected to the cell capacitor CC. A gate of the cell transistor CT may be connected to a wordline WL.

According to an example embodiment, the memory device 1200 may perform a read operation or a refresh operation based on the amount of charges of the cell capacitor CC included in the memory cell MC. In this case, the bitline BL connected to the memory cell MC may be precharged to a precharge voltage VBL. Then, as the wordline WL is activated, a charge sharing operation may occur between the charges of the bitline BL charged to the precharge voltage VBL and the charges of the cell capacitor CC of the memory cell MC. The charge sharing operation may cause a voltage of a bitline BL to increase or decrease from the precharge voltage VBL by the voltage change amount Vdt. The bitline sense amplifier 1230 may sense the voltage change amount Vdt and may amplify the sensed voltage change amount Vdt. The bitline sense amplifier 1230 may measure the voltage of the bitline BL based on the voltage change amount Vdt, and may sense data stored in a memory cell MC based on the voltage of the bitline BL. As an example, when the voltage of the bitline BL increases from the precharge voltage VBL by the voltage change amount Vdt, the bitline sense amplifier 1230 may sense data of the memory cell MC as data at a high level (or logic "1"). When the voltage of the bitline BL decreases from the precharge voltage VBL by the voltage change amount Vdt, the bitline sense amplifier 1230 may sense the data of the memory cell MC as data at a low level (or logic "0").

Figure 4:
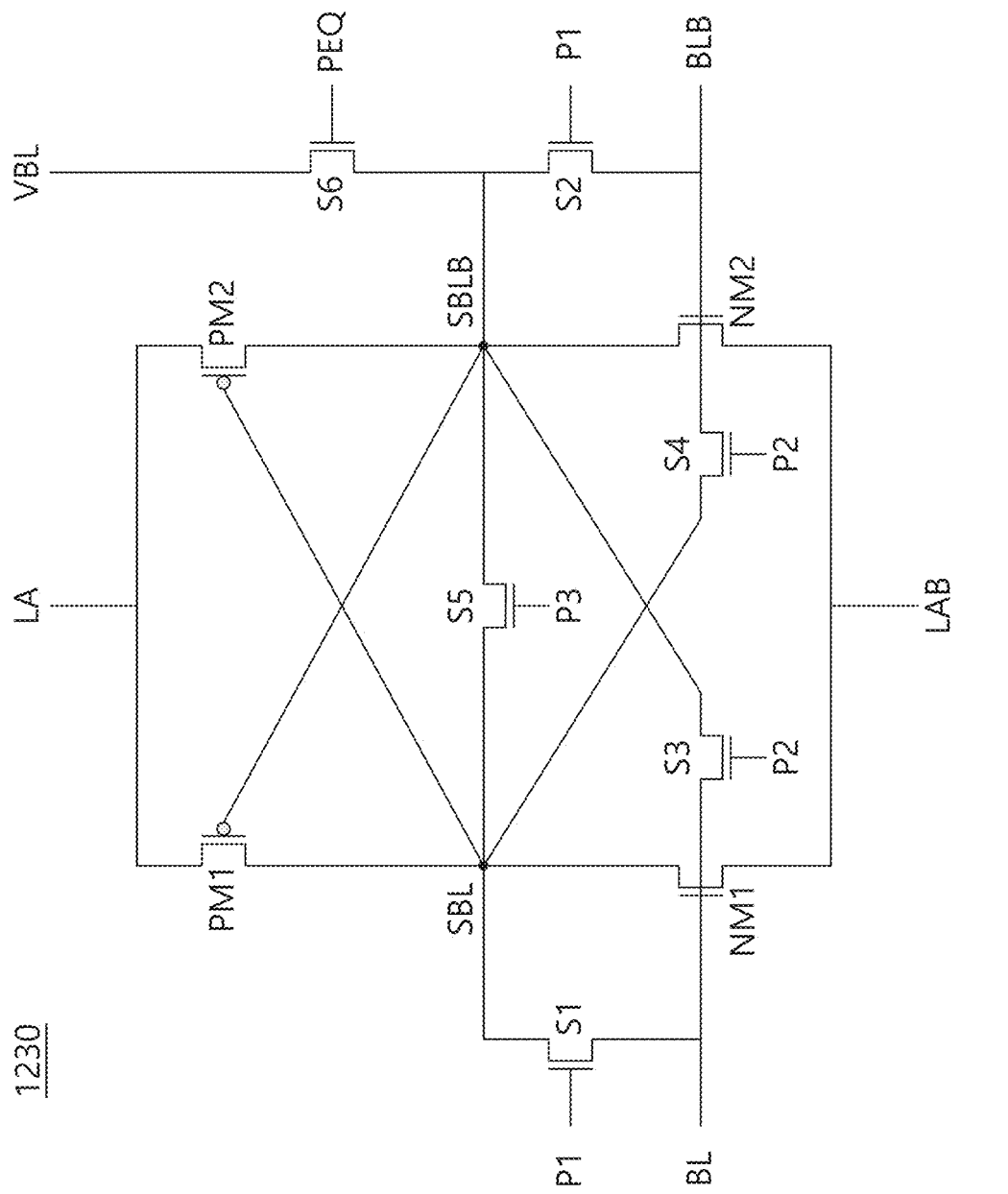
FIG. 4 is a diagram illustrating a bitline sense amplifier, connected to a single bitline, among bitline sense amplifiers of FIG. 2.

FIG. 4 is a diagram illustrating a bitline sense amplifier, connected to a single bitline, among bitline sense amplifiers of FIG. 2. Referring to FIGS. 2 to 4, the bitline sense amplifier 1230 may include an N-type sense amplifier and a P-type sense amplifier. For example, the N-type sense amplifier may include N-type transistors (for example, a first N-type transistor NM1 and a second N-type transistor NM2). The P-type sense amplifier may include P-type transistors (for example, a first P-type transistor PM1 and a second P-type transistor PM2). The N-type sense amplifier and the P-type sense amplifier may amplify the voltage change amount Vdt of the bitline BL depending on a specified ratio during a bitline sensing operation.

According to an example embodiment, the bitline sense amplifier 1230 may include a plurality of switching transistors. For example, a first switching transistor S1 may be connected between the bitline BL and a sensing bitline SBL. The first switching transistor S1 may connect or disconnect between the bitline BL and the sensing bitline SBL based on a first switching signal P1. A second switching transistor S2 may be connected between a complementary bitline BLB and a complementary sensing bitline SBLB. The second switching transistor S2 may connect or disconnect between the complementary bitline BLB and the complementary sensing bitline SBLB based on the first switching signal P1. A third switching transistor S3 may be connected between the bitline BL and the complementary sensing bitline SBLB. The third switching transistor S3 may connect or disconnect between the bitline BL and the complementary sensing bitline SBLB based on a second switching signal P2. A fourth switching transistor S4 may be connected between the complementary bitline BLB and the sensing bitline SBL. The fourth switching transistor S4 may connect or disconnect between the complementary bitline BLB and the sensing bitline SBL based on the second switching signal P2. A fifth switching transistor S5 may be connected between the sensing bitline SBL and the complementary sensing bitline SBLB. The fifth switching transistor S5 may connect or disconnect between the sensing bitline SBL and the complementary sensing bitline SBLB based on a third switching signal P3. A sixth switching transistor S6 may be connected between a line of the precharge voltage VBL and the complementary sensing bitline SBLB. The sixth switching transistor S6 may connect or disconnect between the line of the precharge voltage VBL and the complementary sensing bitline SBLB based on an equalization signal PEQ.

According to an example embodiment, the N-type sense amplifier and the P-type sense amplifier are connected between the sensing bitline SBL and the complementary sensing bitline SBLB, and may sense and amplify a difference in voltage between the bitline BL and the complementary bitline BLB based on voltages of a control line LA and a complementary control line LAB. For example, one end of the first P-type transistor PM1 may be connected to the control line LA, the other end of the first P-type transistor PM1 may be connected to the sensing bitline SBL, and a gate of the first P-type transistor PM1 may be connected to the complementary sensing bitline SBLB. One end of the second P-type transistor PM2 may be connected to the control line LA, the other end of the second P-type transistor PM2 may be connected to the complementary sensing bitline SBLB, and a gate of the second P-type transistor PM2 may be connected to the sensing bitline SBL. One end of the first N-type transistor NM1 may be connected to the sensing bitline SBL, the other end of the first N-type transistor NM1 may be connected to the complementary control line LAB, and a gate of the first N-type transistor NM1 may be connected to the bitline BL. One end of the second N-type transistor NM2 may be connected to the complementary sensing bitline SBLB, the other end of the second N-type transistor NM2 may be connected to the complementary control line LAB, and a gate of the second N-type transistor NM2 may be connected to the complementary bitline BLB.

According to an example embodiment, the bitline sense amplifier 1230 may sense data of the memory cell MC connected to the bitline BL. For example, the bitline sense amplifier 1230 may control switching transistors (for example, the first to sixth switching transistors S1, S2, S3, S4, S5, and S6) during a precharge operation, a charge sharing operation, and a sensing operation. The bitline sense amplifier 1230 may sense data of the memory cell MC connected to the bitline BL through the precharge operation, the charge sharing operation, and the sensing operation.

Figure 5:
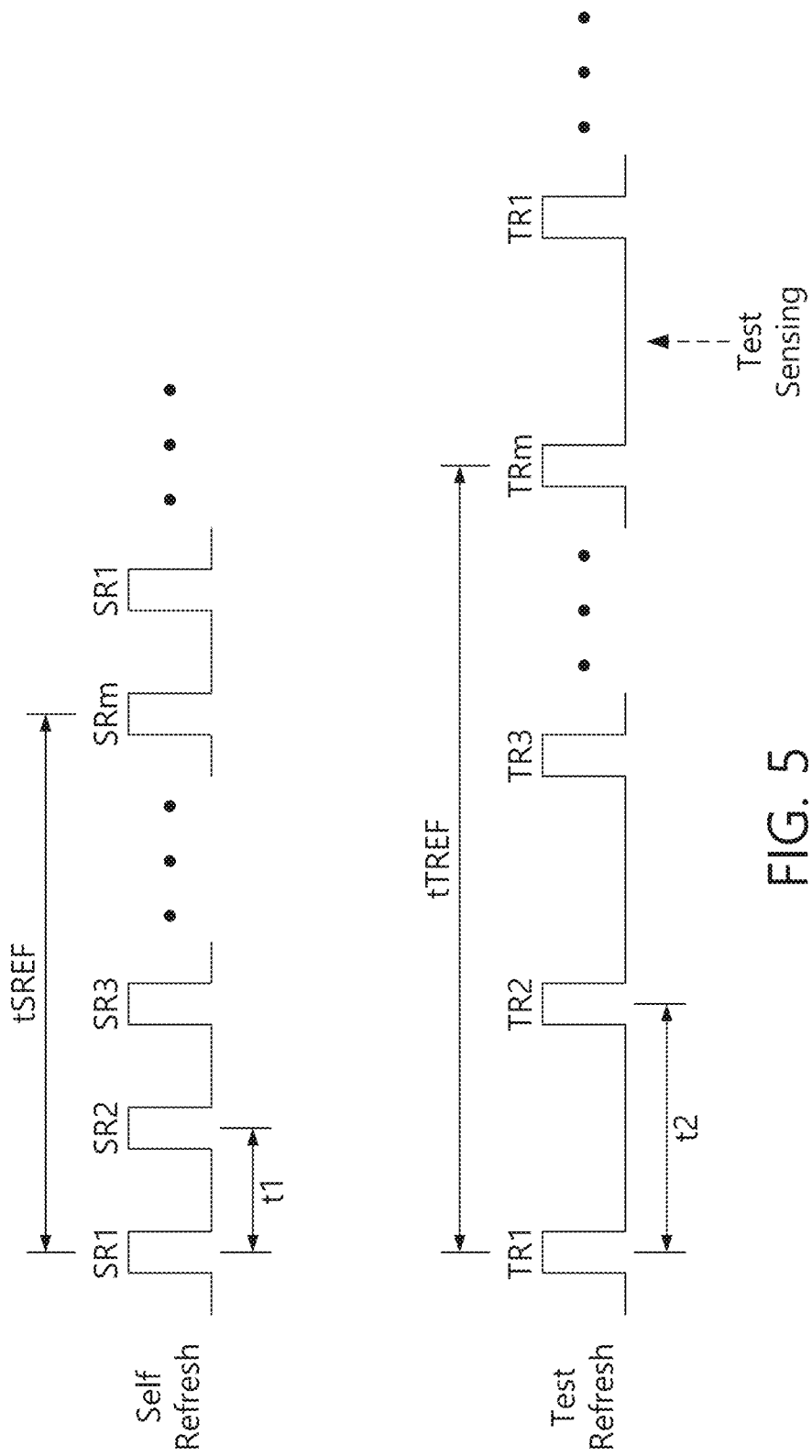
FIG. 5 is a diagram illustrating a period of test refresh used in a method of predicting life expectancy of a memory cell according to an example embodiment.

FIG. 5 is a diagram illustrating a period of a test refresh operation used in a method of predicting life expectancy of a memory cell according to an example embodiment. Referring to FIGS. 2 and 5, the memory device 1200 may perform test refresh operation having a period that is different from a period of a self-refresh, to thereby predict the life expectancy of a memory cell. Thus, according to an example embodiment, the memory device 1200 may periodically perform self-refresh to maintain data stored in memory cells. For example, the memory device 1200 may perform self-refresh by sequentially selecting wordlines connected to a memory cell array 1210. The memory device 1200 may determine a total self-refresh time tSREF during which self-refresh is performed on all wordlines once. The total self-refresh time tSREF (for example, 64 milliseconds (ms)) may be set in consideration of retention times of memory cells. As an example, the memory device 1200 may perform first self-refresh SR1 corresponding to a first wordline. Similarly, when the number of wordlines is m, the memory device 1200 may perform self-refreshes SR1, SR2, SR3 to SRm, respectively corresponding to wordlines. A first time period t1 may be required between the respective self-refreshes (for example, between the first self-refresh SR1 and the second self-refresh SR2).

Furthermore, the memory device 1200 may perform a test refresh operation for a method of predicting life expectancy of a memory cell. For example, the memory device 1200 may perform test refresh, separate and independent of the self-refresh, to predict the life expectancy of a memory cell. As shown by FIG. 5, the test refresh may be performed at a longer cycle than the self-refresh. The memory device 1200 may determine a total test refresh time tTREF during which test refresh is performed on all wordlines once. The total test refresh time tTREF may be set to be longer than the total self-refresh time tSREF. As an example, the total test refresh time tTREF (for example, 128 ms) may be set to be an integer multiple of the total self-refresh time tSREF. The memory device 1200 may perform first test refresh TR1 corresponding to the first wordline. Similarly, when the number of wordlines is m, the memory device 1200 may perform test refreshes TR1, TR2, TR3 to TRm, respectively corresponding to the wordlines. A second time period t2 may be required between the respective test refreshes (for example, between the first test refresh TR1 and the second test refresh TR2). The second time period t2 may be set to be greater than a first time period t1. Alternatively, the second time period t2 may be set to be an integer multiple of the first time period t1.

According to an example embodiment, the memory device 1200 may detect a deteriorated memory cell using a test refresh operation. For example, when a refresh period is increased, a current leakage phenomenon may occur in the degraded memory cell. Thus, when self-refresh is performed, the deteriorated memory cell may maintain stored data as it is. However, when test refresh having a period that is longer than a period of self-refresh is performed, substantial current may leak, and thus the deteriorated memory cell may not retain sored data as it is. The memory device 1200 may store dummy data in memory cells and perform a test refresh, and may then perform test sensing to detect the number of memory cells which do not maintain the dummy data. The memory device 1200 may predict life expectancy of the memory device 1200 based on the number of the memory cells which do not maintain the dummy data.

Figure 6:
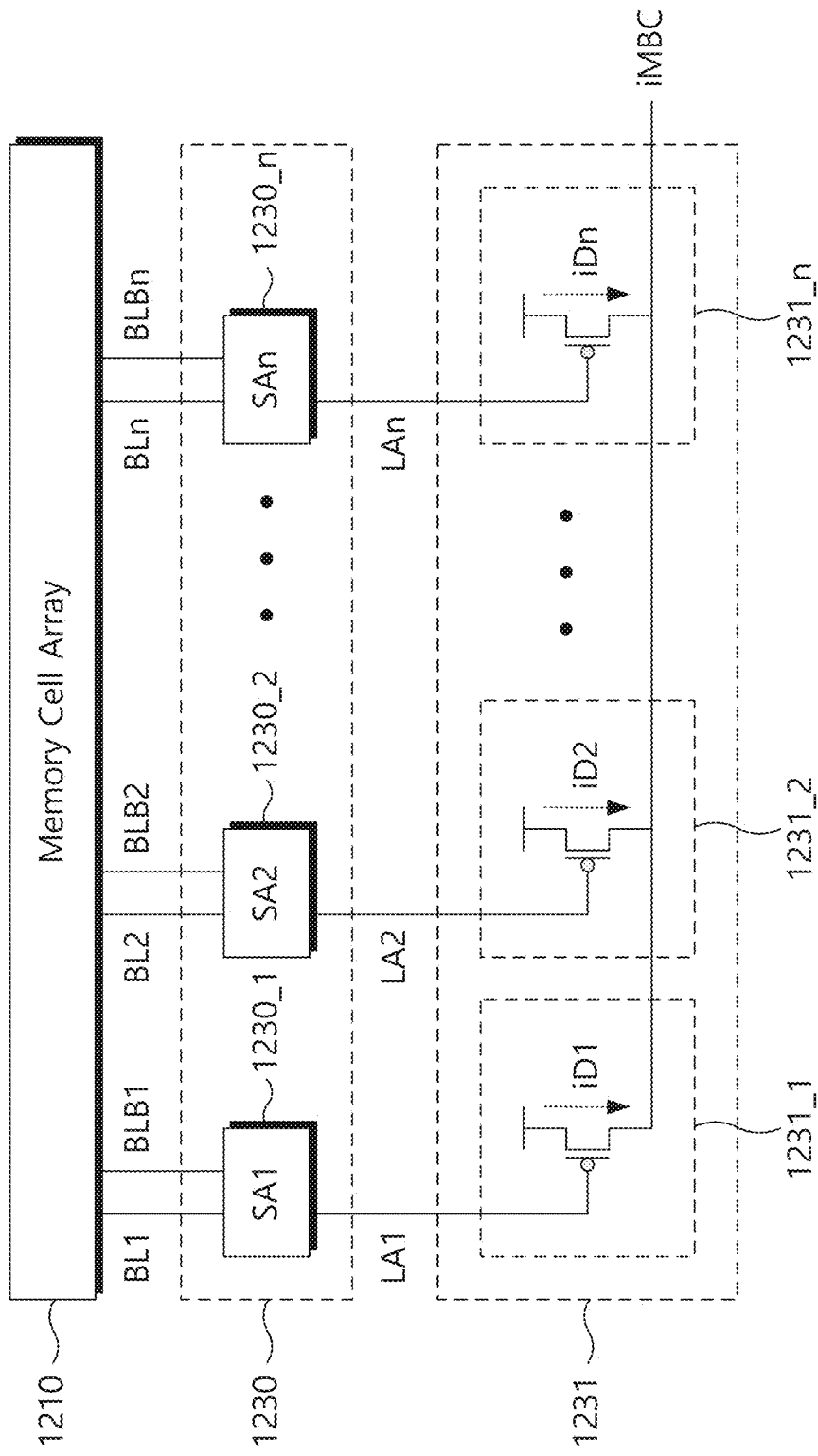
FIG. 6 is a diagram illustrating a data merge path for predicting life expectancy of a memory cell included in the memory cell array of FIG. 2.
Figure 7:
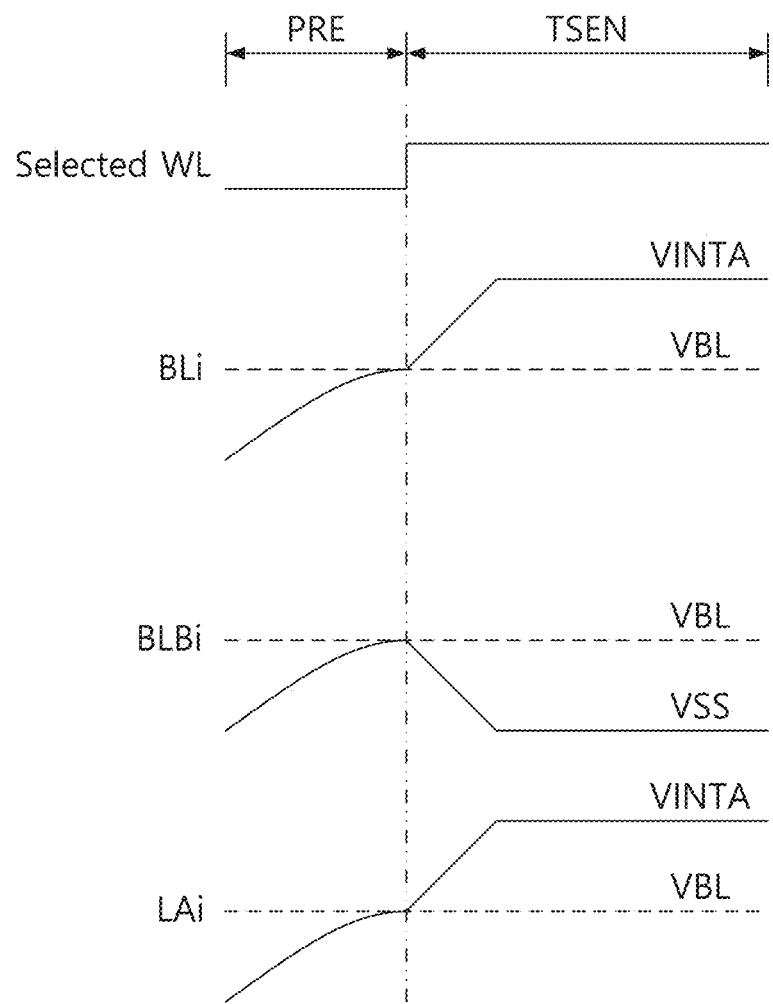
FIG. 7 is a timing diagram illustrating a state of a normal memory cell during test sensing, according to an example embodiment.
Figure 8:
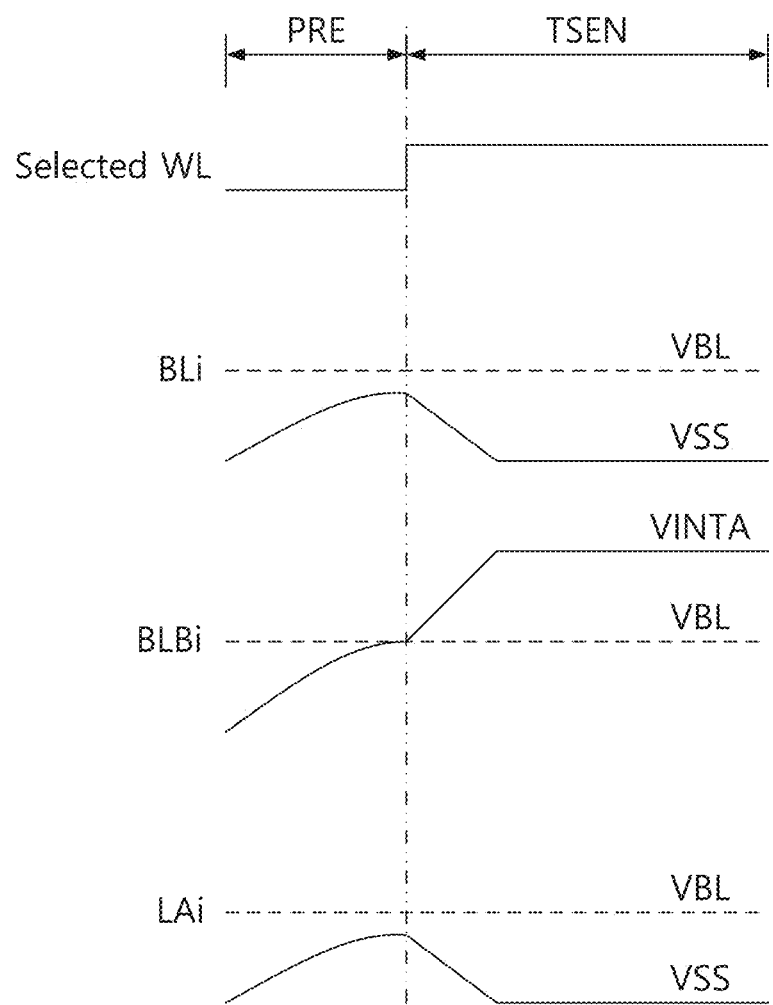
FIG. 8 is a timing diagram illustrating a state of a deteriorating memory cell during test sensing, according to an example embodiment.

FIG. 6 is a diagram illustrating a data merge path for predicting life expectancy of a memory cell included in the memory cell array of FIG. 2. FIG. 7 is a timing diagram illustrating a state of a normal memory cell during test sensing, according to an example embodiment. FIG. 8 is a timing diagram illustrating a state of a deteriorating memory cell during test sensing, according to an example embodiment. Referring to FIGS. 2 to 8, after storing dummy data in memory cells connected to a selected wordline and performing test refresh, the bitline sense amplifier 1230 may performs a test sensing operation on the memory cells connected to the selected wordline. A degradation detection circuit 1231 may measure multi-bit-count current iMBC during the test sensing operation. The degradation detection circuit 1231 may be included within the bitline sense amplifier 1230, or configured as a separate circuit entirely independent of the bitline sense amplifier 1230.

According to an example embodiment, the bitline sense amplifier 1230 may include sense amplifiers, respectively connected to memory cells included in the memory cell array 1210. For example, when the number of memory cells connected to a single wordline is n (where n is a positive integer), the bitline sense amplifier 1230 may include n sense amplifiers 1230_1, 1230_2 to 1230_*n*. Each of the sense amplifiers 1230_1, 1230_2 to 1230_*n* may be configured as illustrated in FIG. 4. For example, the first sense amplifier 1230_1 may be connected to a first bitline BL1, a first complementary bitline BLB1, and a first control line LA1. The first control line LA1 may be connected to a first degradation detection path 1231_1. The first degradation detection path 1231_1 may output first degradation detection current iD1 based on a voltage level of the first control line LA1.

According to an example embodiment, the degradation detection circuit 1231 may include degradation detection paths 1231_1, 1231_2 to **1231_*n*, respectively corresponding to the sense amplifiers 1230_1, 1230_2 to 1230_*n*. For example, control lines LA1, LA2 to LAn of the sense amplifiers 1230_1, 1230_2 to 1230_*n* may be connected to the degradation detection paths 1231_1, 1231_2 to 1231_*n*, respectively. The degradation detection paths 1231_1, 1231_2 to 1231_*n* may output or may not outputs degradation detection currents iD1, iD2 to iDn based on voltages of the control lines LA1, LA2 to Lan, respectively. The degradation detection circuit 1231** may merge the degradation detection currents iD1, iD2 to iDn into single current to output the multi-bit-count current iMBC.

According to an example embodiment, the memory device 1200 may store dummy data in the memory cell array 1210 and performs a test refresh, and may then confirm the multi-bit-count current iMBC for each wordline. For example, memory cells included in the memory cell array 1210 may exhibit different aspects depending on the degree of deterioration. FIGS. 7 and 8 are timings illustrating voltages on nodes of the bitline sense amplifier 1230 when test sensing is performed after storing dummy data at a high level (or logic "1") in a memory cell and performing test refresh.

As an example, FIG. 7 may illustrate test sensing of a normal memory cell. Referring to FIG. 7, in the case of a normal memory cell, data of the memory cell may be normally maintained even after performing test refresh, similarly to self-refresh. A voltage of the bitline BLi, a voltage of the complementary bitline BLBi, and a voltage of the control line LAi may be charged to a precharge voltage VBL during a precharge period PRE. Through the charge sharing operation in a test sensing period TSEN, the voltage of the bitline BLi and the voltage of the control line LAi may be changed to a first internal voltage VINTA and, in contrast to the voltage of the bitline BLi, the voltage of the complementary bitline BLBi may be changed to a second internal voltage VSS. The voltage of the control line LAi may be changed based on the voltage of the bitline BLi. The control line LAi of the corresponding sense amplifiers 1230_1, 1230_2 to **1230_*n* may be at a high level (or logic "1"), and the corresponding degradation detection paths 1231_1, 1231_2 to 1231_*n*** may not output the corresponding degradation detection current iD1, iD2 to iDn.

As an example, FIG. 8 may illustrate test sensing of a deteriorating memory cell. Referring to FIG. 8, in the case of a degraded memory cell, unlike self-refresh, after test refresh is performed, data of the memory cell may not be normally maintained due to deterioration of a cell transistor or a cell capacitor. The voltage of the complementary bitline BLBi may be charged to the precharge voltage VBL during the precharge period PRE. However, the voltage of the bitline BLi and the voltage of the control line LAi may be charged to the precharge voltage VBL according to current leakage of the cell transistor or the cell capacitor. Through the charge sharing operation in a test sensing period TSEN, the voltage of the bitline BLi and the voltage of the control line LAi may be changed to a second internal voltage VSS and, in contrast to the voltage of the bitline BLi, the voltage of the complementary bitline BLBi may be changed to a first internal voltage VINTA. The voltage of the control line LAi may be changed according to the voltage of the bitline BLi. The control line LAi of the corresponding sense amplifiers 1230_1, 1230_2 to **1230_*n* may be at a low level (or logic "0"), and the corresponding degradation detection paths 1231_1, 1231_2 to 1231_*n*** may output corresponding degradation detection current iD1, iD2 to iDn.

According to an example embodiment, the multi-bit-count current iMBC may increase in proportion to the number of deteriorated memory cells, among memory cells connected to a selected wordline. For example, the degradation detection circuit 1231 may include degradation detection paths 1231_1, 1231_2 to **1231_*n*, respectively corresponding to the sense amplifiers 1230_1, 1230_2 to 1230_*n*. The degradation detection paths 1231_1, 1231_2 to 1231_*n* may output or may not output degradation detection currents iD1, iD2 to iDn based on voltages of control lines LA1, LA2 to LAn of the sense amplifiers 1230_1, 1230_2 to 1230_*n*, respectively. As an example, each of the degradation detection paths 1231_1, 1231_2 to 1231_*n* may include a PMOS transistor. When a voltage of each of the control lines LA1, LA2 to LAn is at a high level (or logic "1") (for example, when a corresponding memory is normal), the deterioration detection paths 1231_1, 1231_2 to 1231_*n* may output deterioration detection currents iD1, iD2 to iDn, respectively. When a voltage of each of the control lines LA1, LA2 to LA n is at a low level (or logic "0") (for example, when a corresponding memory cell is deteriorated), the deterioration detection paths 1231_1, 1231_2 to 1231_*n*** may not output the deterioration detection currents iD1, iD2 to iDn, respectively. The deterioration detection currents iD1, iD2 to iDn may be merged into single current to output multi-bit-count current iMBC.

Figure 9:
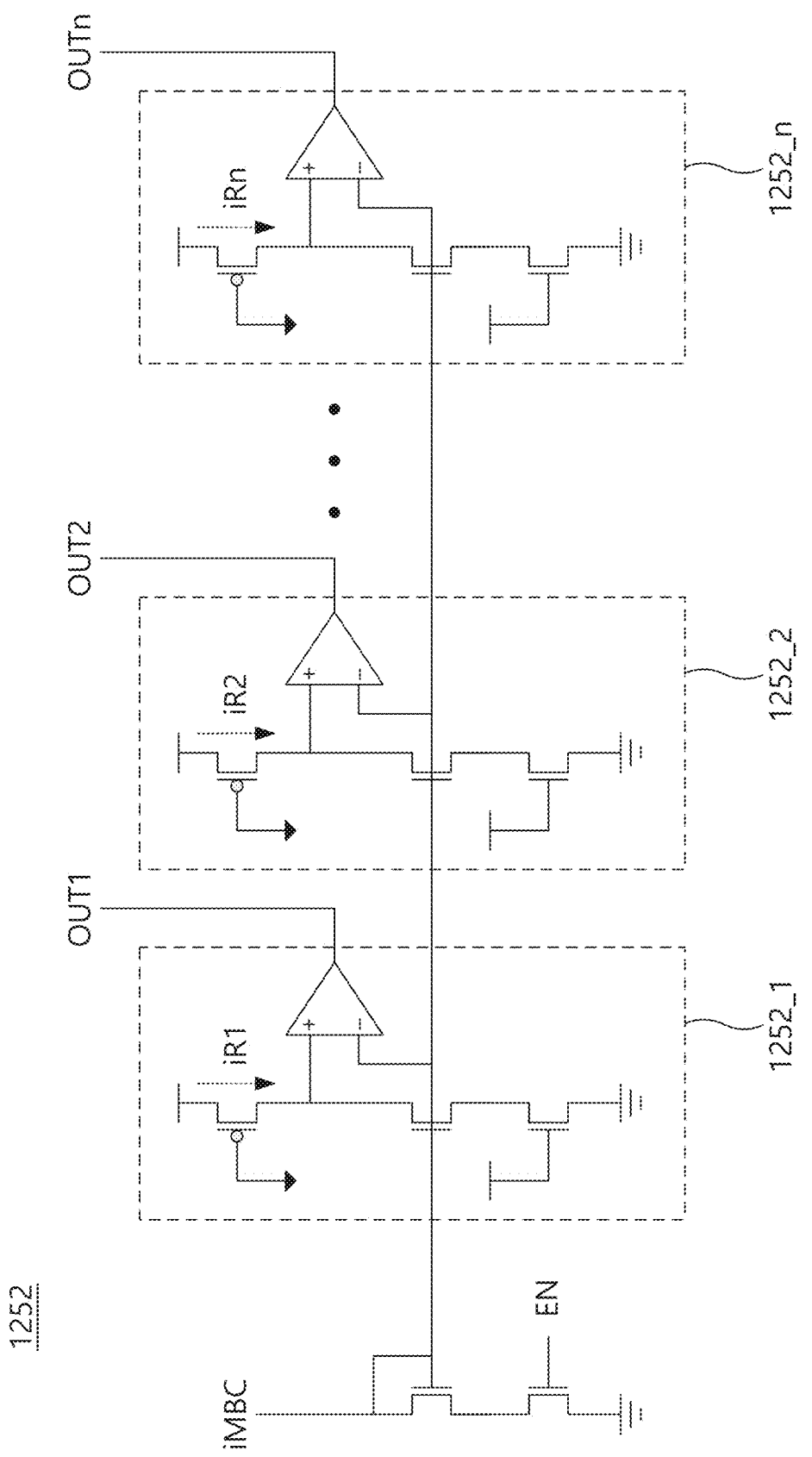
FIG. 9 is a diagram illustrating a multi-bit counter detecting the number of deteriorated memory cells based on multi-bit-count current obtained by a deterioration detection circuit of FIG. 6.

FIG. 9 is a diagram illustrating a multi-bit counter detecting the number of deteriorated memory cells based on multi-bit-count current obtained by a deterioration detection circuit of FIG. 6. FIG. 10 is a table for predicting life expectancy of a memory device based on a result of the multi-bit counter of FIG. 9. Referring to FIGS. 9 and 10, the memory device 1200 may predict life expectancy of memory cells included in the memory cell array 1210 based on the multi-bit-count current iMBC. The memory device 1200 may include a multi-bit counter 1252. The multi-bit counter 1252 may be included in the control logic 1250, or may be implemented to independent of the control logic 1250.

According to an example embodiment, the multi-bit counter 1252 may include a plurality of bit counters 1252_1, 1252_2 to **1252_*n*. For example, the multi-bit-count current iMBC may be transmitted to the bit counters 1252_1, 1252_2 to 1252_*n* based on an enable signal EN. A single bit counter (for example, a first bit counter 1252_1) may compare reference current (for example, first reference current iR1) with the multi-bit-count current iMBC to obtain a result value (for example, a first result value OUT1). As an example, reference currents iR1, iR2 to iRn of the bit counters 1252_1, 1252_2 to 1252_*n* may be gradually increased. A current increment between the gradually increased reference currents iR1, iR2 to iRn may be the same as a magnitude of each of the deterioration detection currents iD1, iD2 to iDn of FIG. 6. The number of bit counters 1252_1, 1252_2 to 1252_*n* may be the same as the number of memory cells connected to a single wordline. Each of the bit counters 1252_1, 1252_2 to 1252_*n* may include a comparator comparing the multi-bit-count current iMBC with the reference currents iR1, iR2 to iRn. Capacity of the comparators, included in the bit counters 1252_1, 1252_2 to and 1252_*n*, may be gradually increased to correspond to the magnitudes of the reference currents iR1, iR2 to and iRn. The comparator, included in the first bit counter 1252_1, may have lowest capacity. The comparator, included in the n-th bit counter 1252_*n***, may have highest capacity. However, this is merely exemplary and the number and configuration of the bit counters 1252_1, 1252_2 to 1252_n are not limited thereto.

According to an example embodiment, the memory device 1200 may measure the number of fail memory cells, connected to a selected wordline, based on result values of the multi-bit counter 1252. For example, in FIG. 10, when the multi-bit-count current iMBC is lower than the first reference current iR1, the bit counters 1252_1, 1252_2 to 1252_n may all output result values OUT1, OUT2 to OUTn at a low level (or logic "0"). In this case, the control logic 1250 may determine that there is no fail memory cell connected to the selected wordline. When the multi-bit-count current iMBC is higher than or equal to the first reference current iR1 and lower than the second reference current iR2, the first bit counter 1252_1 may output a result value OUT1 at a high level (or logic "1"), and the other bit counters 1252_2 to 1252_n may output result values OUT2 to OUTn at a low level (or logic "0"). In this case, a single first bit counter 1252_1 has the output value OUT1 at a high level (or logic "1"), so that the control logic 1250 may determine that the number of the fail memory cells connected to the selected wordline is one. Similarly, the number of the output values OUT1, OUT2 to OUTn, changed to be at a high level as the multi-bit-count current iMBC is increased, may be increased. In this case, the control logic 1250 may determine the number of bit counters have a result value at a high level (or logic "1") as the number of the fail memory cells connected to the selected wordline. When the multi-bit-count current iMBC is higher than or equal to the n-th reference current iRn, the bit counters 1252_1, 1252_2 to 1252_n may all output result values OUT1, OUT2 to OUTn at a high level (or logic "1"). In this case, the control logic 1250 may determine that all of the memory cells connected to the selected wordline are fail memory cells.

As described above, the memory device 1200 may confirm the number (or range) of deteriorated memory cells through test refresh and a test sensing operation performed once on selected memory cells connected to the selected wordline without confirming data of each of the memory cells. In addition, the memory device 1200 may confirm the number of deteriorated memory cells using only wordlines to be tested without wordlines to be compared. Accordingly, the memory device 1200 can save time and energy required to confirm the number of deteriorated memory cells of the selected wordline.

Figure 11:
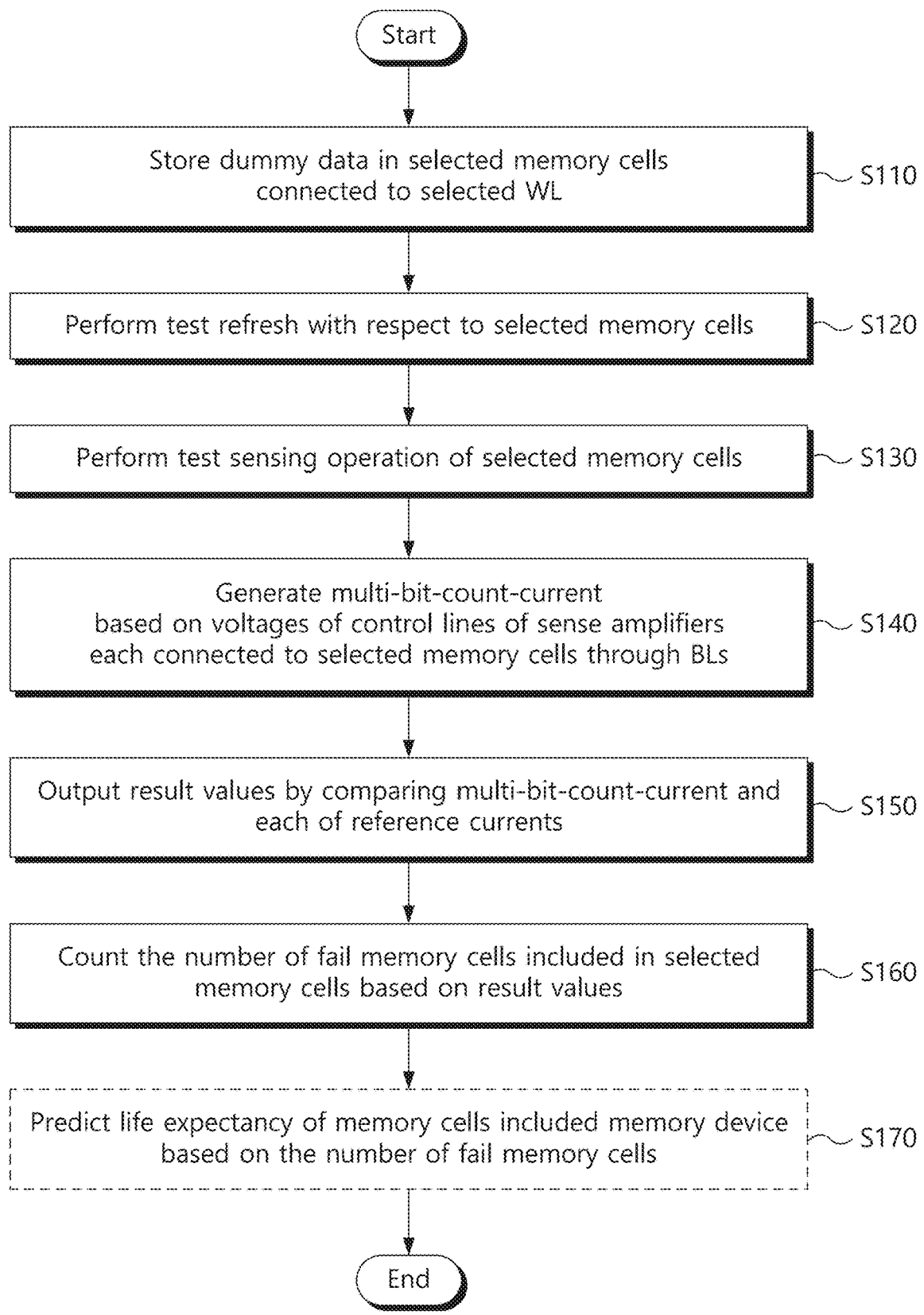
FIG. 11 is a flowchart illustrating a method of predicting life expectancy of a memory device according to an example embodiment.

FIG. 11 is a flowchart illustrating a method of predicting life expectancy of a memory device according to an example embodiment. Referring to FIGS. 2 to 11, the memory device 1200 may predict life expectancy of memory cells included in the memory cell array 1210 through a test sensing operation.

According to an example embodiment, in operation S110, the control logic 1250 of the memory device 1200 may store dummy data in selected memory cells connected to the selected wordline. For example, the control logic 1250 may use dummy data including various data patterns regarding situations. As an example, in the case of a normal memory cell, dummy data may include bits, all having a value sensed to have a high level by a bitline sense amplifier. As another example, in the case of a normal memory cell, dummy data may include alternate bits, sensed to have a high level and sensed to have a low level by a bitline sense amplifier, in consideration of an interference effect between adjacent bitlines. As another example, dummy data may have a specified pattern to specify some memory cells.

According to an example embodiment, in operation S120, the control logic 1250 may perform test refresh on the selected memory cells. For example, when the self-refresh is performed with a first period, the control logic 1250 may perform test refresh with a second period, longer than the first cycle. For example, the second period may be set to be an integer multiple of the first period. As another example, the control logic 1250 may repeatedly perform the test refresh of operation S120 and a test sensing operation of operation S130 while changing the second period. Accordingly, the control logic 1250 may determine how much memory cells are deteriorated for each wordline.

According to an example embodiment, in operation S130, the control logic 1250 may perform a test sensing operation of the selected memory cells. For example, a test sensing operation may be performed in a manner, which is the same as or similar to a manner of a data sensing operation according to the related art. During the test sensing operation, the normal memory cell may output a high level (or logic "1) without leakage current, similarly to stored dummy data. The deteriorated memory cell may output a low level (or logic "0") due to excessive leakage current, unlike stored dummy data.

According to an example embodiment, in operation S140, the deterioration detection circuit 1231 generate multi-bit-count current iMBC during the test sensing operation based on the voltages of the control lines LA1, LA2 to LAn of the sense amplifiers 1230_1, 1230_2 to 1230_n, respectively connected to the selected memory cells through bitlines. For example, the degradation detection circuit 1231 may include degradation detection paths 1231_1, 1231_2 to 1231_n, respectively corresponding to the sense amplifiers 1230_1, 1230_2 to 1230_n. The control lines LA1, LA2 to LAn of the sense amplifiers 1230_1, 1230_2 to 1230_n may be connected to the degradation detection paths 1231_1, 1231_2 to 1231_n, respectively. The degradation detection paths 1231_1, 1231_2 to 1231_n may output or may not output degradation detection currents iD1, iD2 to iDn based on the voltages of the control lines LA1, LA2 to LAn, respectively. The degradation detection circuit 1231 may merge the degradation detection currents iD1, iD2 to iDn into single current to output the multi-bit-count current iMBC.

According to an example embodiment, in operation S150, the multi-bit counter 1252 may compares the multi-bit-count current iMBC and each of reference currents iR1, iR2 to iRn to output result values OUT1, OUT2 to OUTn. For example, the multi-bit counter 1252 may include a plurality of bit counters 1252_1, 1252_2 to 1252_n. The multi-bit-count current iMBC may be transmitted to the bit counters 1252_1, 1252_2 to 1252_n based on an enable signal EN. The reference currents iR1, iR2 to iRn of the bit counters 1252_1, 1252_2 to 1252_n may be gradually increased.

As an example, a current increment between the gradually increased reference currents iR1, iR2 to iRn may the same as a magnitude of each of the deterioration detection currents iD1, iD2 to iDn of FIG. 6. The number of bit counters 1252_1, 1252_2 to 1252_n may be the same as the number of memory cells connected to a single wordline. Each of the bit counters 1252_1, 1252_2 to 1252_n may include a comparator comparing the multi-bit-count current iMBC with each of the reference currents iR1, iR2 to iRn. Capacity of the comparators, included in the bit counters 1252_1, 1252_2 to and 1252_n, may be gradually increased to correspond to the magnitudes of the reference currents iR1, IR2 to and iRn. A comparator, included in the first bit counter 1252_1, may have lowest capacity. A comparator, included in the n-th bit counter 1252_n, may have highest capacity. However, this is merely exemplary and the number and configuration of the bit counters 1252_1, 1252_2 to 1252_n are not limited thereto.

As another example, the number of bit counters 1252_1, 1252_2 to 1252_n may be less than the number of memory cells connected to a single wordline. The bit counters 1252_1, 1252_2 to 1252_n may be divided according to designated specified intervals, and the multi-bit counter 1252 may confirm a current interval corresponding to the magnitude of the multi-bit-count current iMBC.

According to an example embodiment, in operation S160, the control logic 1250 may count the number of the deteriorated memory cells, included in the selected memory cells, based on the result values OUT1, OUT2 to OUTn. For example, the control logic 1250 may determine the number of bit counters 1252_1, 1252_2 to 1252_n, outputting result values at a high level, as the number of deteriorated memory cells, among the selected memory cells. As the multi-bit-count current iMBC is increased, the number of the result values OUT1, OUT2 to OUTn changed to have a high level (or logic "1") may be increased. In this case, the control logic 1250 may determine the number of bit counters, having a result value at a high level (or logic "1"), as the number of fail memory cells connected to the selected wordline. As another example, when the number of bit counters 1252_1, 1252_2 to 1252_n is less than the number of memory cells connected to a single wordline, the control logic 1250 may determine a range to which the number of the fail memory cells belongs.

According to an example embodiment, in operation S170, the control logic 1250 may predict life expectancy of memory cells included in the memory device 1200 based on the number (or range) of the deteriorated memory cells. For example, the control logic 1250 may divide and designate life expectancy of all of the memory cells, included in the memory device 1200, into sections based on the number of the deteriorated memory cells. Alternatively, the control logic 1250 may set life expectancy of memory cells to be different for each wordline. The control logic 1250 may set life expectancy of memory cells to be different depending on periods of the test refresh. Even when the same number of deteriorating memory cells is detected, the control logic 1250 may set the life expectancy of the memory cells to be longer as the periods of the test refresh are increased.

As described above, the memory device 1200 may confirm the number (or range) of the deteriorated memory cells through test refresh and a test sensing operation performed once on the selected memory cells connected to the selected wordline without confirming data of each memory cell. In addition, the memory device 1200 may confirm the number of the deteriorated memory cells using only wordlines to be tested without wordlines to be compared. Accordingly, the memory device 1200 may save time and energy required to confirm the number of deteriorating memory cells of the selected wordline.

In addition, refurbished memory devices may be collected and recycled in a high-capacity memory device (for example, a CXL) to reduce costs. The high-capacity memory device (for example, a CXL) may have a form in which a plurality of memory modules are connected to a single controller. In this case, in the method of predicting life expectancy according to example embodiments, life expectancy of a plurality of memory modules may be predicted to secure reliability of a reusable memory device.

As described above, the number of deteriorated memory cells may be counted through a test sensing operation performed once for each wordline without confirming data of each memory cell. In addition, life expectance of a memory device may be simply predicted based on the number of deteriorated memory cells.

While example embodiments have been shown and described above, it will be apparent to those skilled in the art that modifications and variations could be made without departing from the scope of the present inventive concept as defined by the appended claims.

What is claimed is:

1. A volatile memory device, comprising:
an array of memory cells electrically coupled to a plurality of word lines and a plurality of bitlines;
a bitline sense amplifier electrically coupled to the plurality of bitlines;
control logic electrically coupled to the bitline sense amplifier, said control logic configured to control: (i) consecutive self-refresh operations within the array of memory cells that are spaced apart from each other by a first period, (ii) storage of dummy data within the array of memory cells during operations to predict life expectancy of memory cells therein, (iii) consecutive test refresh operations within the array of memory cells that are spaced apart from each other by a second period greater than the first period, and (iv) performance of a test sensing operation on selected memory cells within the array using the bitline sense amplifier; and
a deterioration detection circuit configured to receive sensing results associated with the selected memory cells from the bitline sense amplifier, and to output multi-bit-count current having a magnitude proportional to a number of deteriorated memory cells among the selected memory cells, based on the sensing results.

2. The device of claim 1,
wherein the control logic is configured to predict a life expectancy of the array of memory cells based on the multi-bit-count current;
wherein the bitline sense amplifier includes sense amplifiers that are electrically connected to the bitlines;
the deterioration detection circuit includes deterioration detection paths, which are respectively connected to control lines of the sense amplifiers; and
wherein the deterioration detection paths are configured to output deterioration detection currents, which correspond to data stored in the selected memory cells, based on a voltage of each of the control lines.

3. The device of claim 2, wherein each of the deterioration detection paths is configured to: (i) output each of the deterioration detection currents when the voltage of each of the control lines is at a first logic level, and (ii) preclude output each of the deterioration detection currents when the voltage of each of the control lines is at a second logic level opposite the first logic level.

4. The device of claim 2, wherein the deterioration detection circuit is configured to merge the deterioration detection currents as the multi-bit-count current.

5. The device of claim 2, wherein the multi-bit-count current has a value corresponding to an integer multiple of each of the deterioration detection currents.

6. The device of claim 2, wherein the control logic comprises a multi-bit counter configured to compare the multi-bit-count current with a reference current; and wherein the multi-bit counter includes bit counters configured to compare the multi-bit-count current with reference currents to output result values, respectively.

7. The device of claim 6, wherein each of the bit counters is configured to: (i) output a low level when the multi-bit-count current is lower than each of the reference currents, and (ii) output a high level when the multi-bit-count current is higher than or equal to each of the reference currents.

8. The device of claim 6, wherein the control logic is configured to determine the number of the bit counters, output a result value at a high level, as the number of deteriorated memory cells among the selected memory cells.

9. The device of claim 1, wherein the dummy data includes all bits, sensed to have a high level by the bitline sense amplifier, in a case of a normal memory cell.

10. The device of claim 1, wherein the dummy data includes alternate bits, sensed to have a high level and sensed to have a low level by a bitline sense amplifier, in a case of a normal memory cell.

11. A volatile memory device, comprising:
a plurality of memory cells connected to wordlines and bitlines;
sense amplifiers electrically connected to the bitlines;
control logic configured to perform self-refresh operations with a first period to maintain data stored in the plurality of memory cells, to store dummy data assigned to the selected memory cells to thereby predict life expectancy of the selected memory cells, and to: (i) perform test refresh operations on the selected memory cells with a second period, longer than the first period, and then (ii) perform a test sensing operations on the selected memory cells through the sense amplifiers;
a deterioration detection circuit including deterioration detection paths respectively connected to control lines of the sense amplifiers, and configured to merge deterioration detection currents respectively output through the detection paths, to thereby output a multi-bit-count current based on a voltage of each of the control lines during the test sensing operations; and
bit counters configured to compare the multi-bit-count current with reference currents to thereby output corresponding result values.

12. The device of claim 11, wherein the control logic is configured to count the number of deteriorated memory cells, among the selected memory cells, based on the result values of the bit counters.

13. The device of claim 12, wherein the control logic assigns predicted life expectancy of the plurality of memory cells based on the second period and the number of the deteriorated memory cells.

14. The device of claim 12, wherein the control logic assigns predicted life expectancy of the selected memory cells for each wordline based on the second period and the number of the deteriorated memory cells.

15. The device of claim 11, wherein the second period is set to be an integer multiple of the first period; and wherein the control logic is configure to repeatedly perform the test refresh and the test sensing operations while changing the second period.

16. A method of predicting life expectancy of a volatile memory device, comprising:
storing dummy data in selected memory cells within the volatile memory device, which are connected to a selected wordline;
performing test refresh operations on the selected memory cells;
performing test sensing operations of the selected memory cells;
generating multi-bit-count current based on a voltage of control lines of sense amplifiers that are electrically connected to the selected memory cells through bitlines, during the test sensing operations;
outputting result values by comparing the multi-bit-count current with each of a plurality of reference currents; and
counting the number of deteriorated memory cells, among the selected memory cells, based on the result values.

17. The method of claim 16, further comprising:
predicting a life expectancy of the plurality of memory cells based on the number of the deteriorated memory cells.

18. The method of claim 16, wherein said generating the multi-bit-count current comprises:
generating deteriorated detection currents based on the voltage of the control lines, respectively; and
merging the deteriorated detection currents to generate the multi-bit-count current.

19. The method of claim 18, wherein each of the deteriorated detection currents is generated as an assigned current value when the voltage of the control lines is at a low level, but is not generated when the voltage of the control lines is at a high level.

20. The method of claim 16, wherein during the outputting the result values: (i) a result value at a low level is output when the multi-bit-count current is lower than each of the reference currents, and (ii) a result value at a high level is output when the multi-bit-count current is higher than or equal to each of the reference currents.

* * * * *